US005644541A

United States Patent [19]
Siu et al.

[11] Patent Number: 5,644,541
[45] Date of Patent: Jul. 1, 1997

[54] MEMORY SUBSTITUTION SYSTEM AND METHOD FOR CORRECTING PARTIALLY DEFECTIVE MEMORIES

[75] Inventors: Philip K. Siu, 11629 Dawson Dr.; Lawrence K. Lo, 14303 Saddle Mountain Dr., both of Los Altos Hills, Calif. 94024; Hing S. Tong, 19335 Dehavilland Dr., Saratoga, Calif. 95070

[73] Assignees: Philip K. Siu; Lawrence K. Lo, both of Los Altos Hills; Hing S. Tong, Saratoga, all of Calif.

[21] Appl. No.: 552,803

[22] Filed: Nov. 3, 1995

[51] Int. Cl.[6] ............................................. G11C 7/00
[52] U.S. Cl. ....................... 365/200; 365/189.07; 365/201
[58] Field of Search ............................ 365/200, 201, 365/189.07; 371/10.1, 27

[56] References Cited

U.S. PATENT DOCUMENTS

| 4,376,300 | 3/1983 | Tang | 365/200 |
| 5,195,057 | 3/1993 | Kasa et al. | 365/200 |
| 5,381,370 | 1/1995 | Lacey et al. | 365/200 |
| 5,402,376 | 3/1995 | Horiguchi et al. | 365/200 |
| 5,416,740 | 5/1995 | Fujita et al. | 365/200 |

*Primary Examiner*—Son T. Dinh
*Attorney, Agent, or Firm*—Thomas E. Schatzel

[57] ABSTRACT

A memory system comprises a plurality of semiconductor memories with some bad bits, a substitution memory and a mapping logic to redirect external memory accesses to bad-bit locations in the semiconductor memories to good storage cells within the substitution memory.

13 Claims, 5 Drawing Sheets

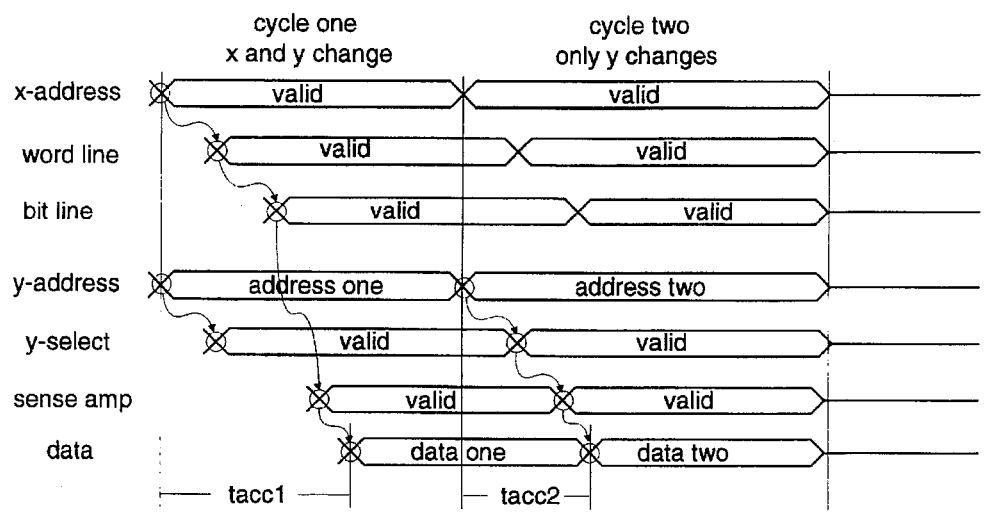
Fig. 2
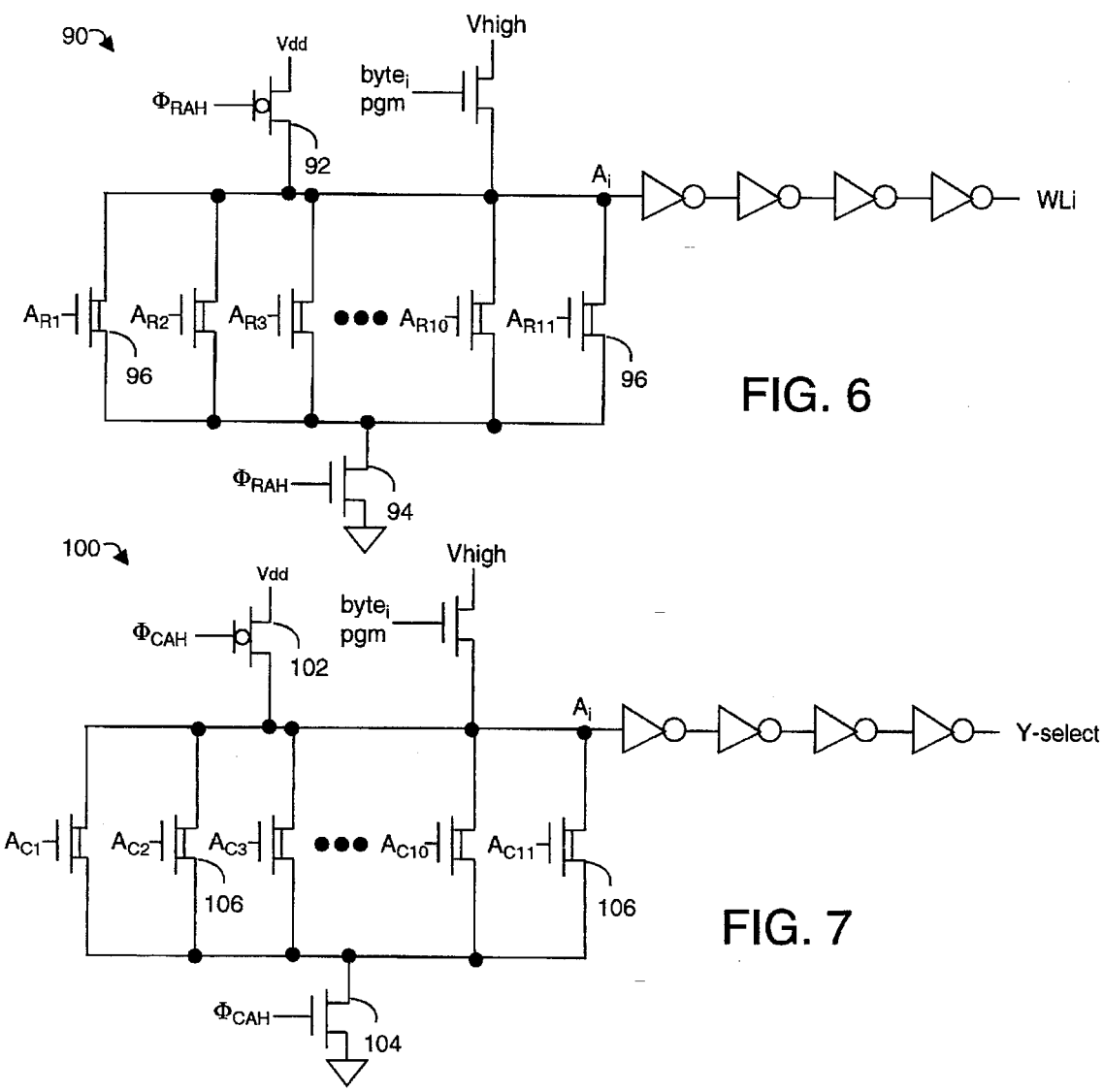
FIG. 6
FIG. 7

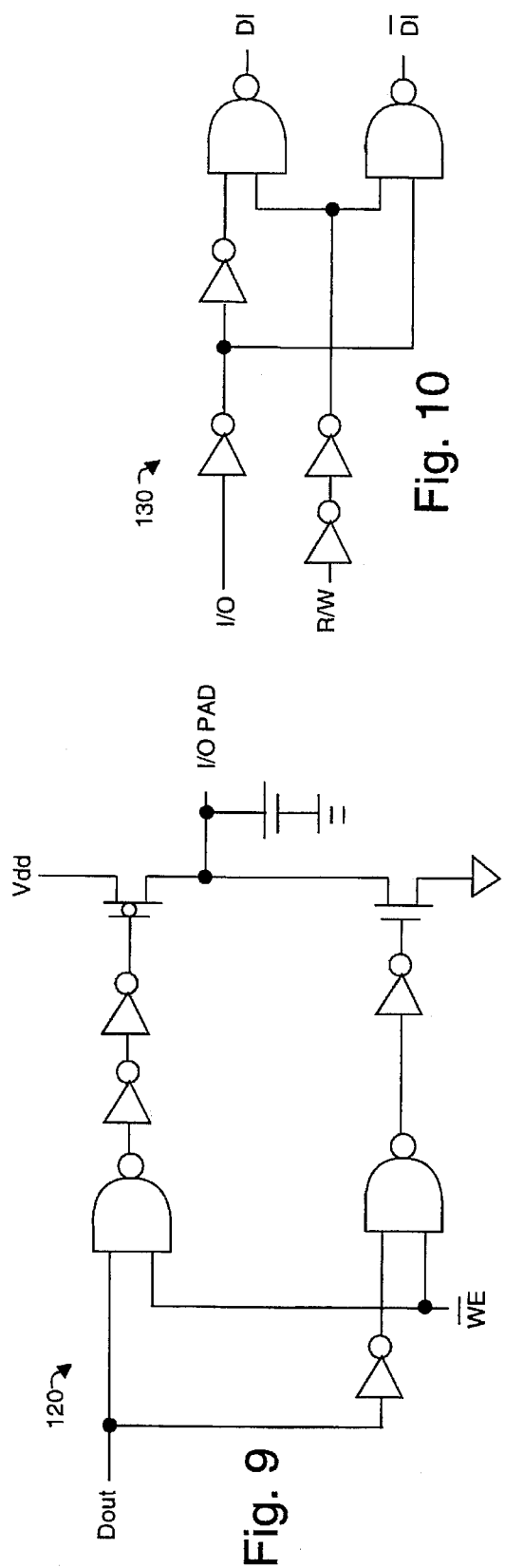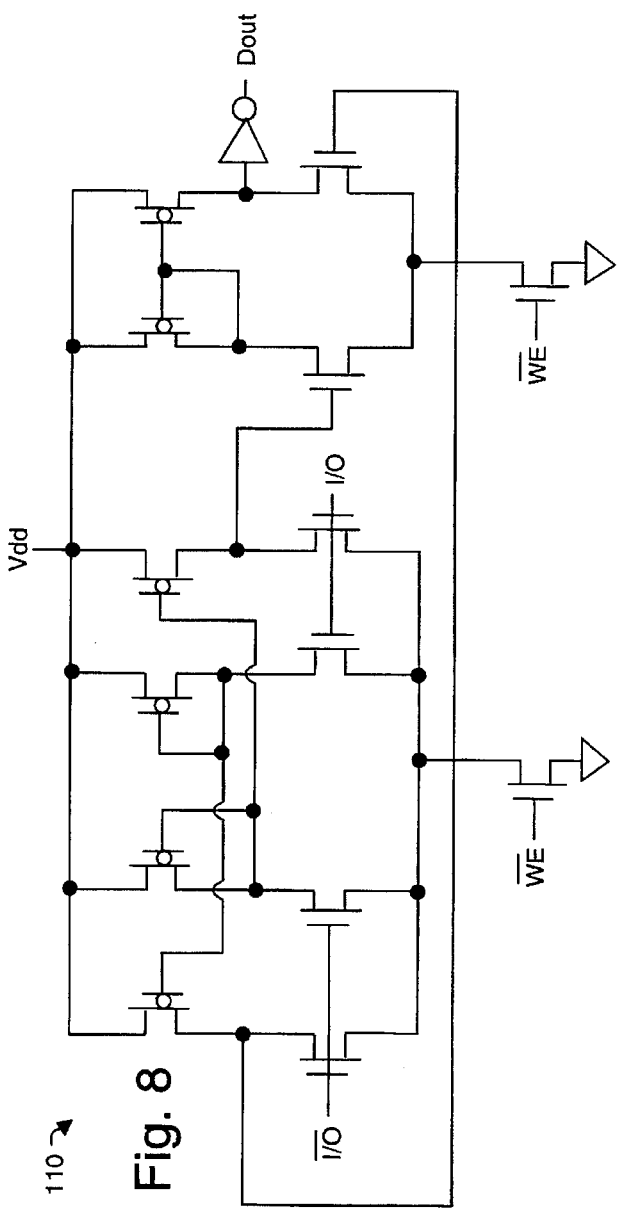

MEMORY SUBSTITUTION SYSTEM AND METHOD FOR CORRECTING PARTIALLY DEFECTIVE MEMORIES

BACKGROUND OF THE INVENTION

1. Field of the Invention

The invention relates generally to system-level computer memory devices and more specifically to memory modules with almost-good dynamic random access memories.

2. Description of the Prior Art

Dynamic random access memory (DRAM) devices have now advanced beyond storing one million bits of information in a single semiconductor chip. Each bit takes at least one transistor to implement not counting the support circuitry, so the number of things that can be flawed in a single chip during its manufacture can exceed a million. So even an exceedingly good manufacturing fab line will produce thousands of bad parts per millions of parts started. It used to be that bad memories were just thrown away, a total loss. Later, some redundancy was built in to repair the bad bits, but the required die sizes got too large to make repairing every bit practical. It was recognized that DRAM devices that were not perfect, and therefore not suited to computer data storage, could be useful as video or audio memory because an occasional bad bit was not fatal in such applications.

Such "mostly good" DRAM devices can nevertheless be successfully used in computer data storage applications when a second, repair memory is wired in tandem to respond when a faulty bit is being accessed in the mostly-good DRAM. Siu Tsang describes such a memory system in U.S. Pat. No. 4,376,300, issued Mar. 8, 1983. A redundant memory chip is used to store data intended for the defective addresses in the mostly-good memories. A programmable read only memory (PROM) is illustrated as controlling a switch that steers data to either a single redundant memory device or several mostly-good memories. Whole rows addressed by a system address bus in the mostly-good memories are substituted by equivalent whole rows in the redundant memory, even when only one bit in a row of bits is bad. In a one megabit memory, there are a thousand rows and a thousand columns. Each row therefore comprises a thousand bits. Because of this, the embodiments described by Tsang are very wasteful because good memory is substituted along with the bad. The mostly-good memories must all be of the same type, e.g., with the same row and column organization, and have the same access modes. The systems described require that no two mostly-good memories have bad bits in the same row, due to the simple way that the redundant memory is connected directly to receive the address bus alongside the mostly-good memories.

In his FIG. 2, Tsang proposes the use of a content addressable memory (CAM) in front of the redundant memory address inputs. But, such a method is expensive and the throughput of most CAMs is very poor, compared to the access times of the DRAMs of interest. With microprocessor clock speeds now exceeding one hundred megahertz, such access delays are totally unacceptable.

SUMMARY OF THE PRESENT INVENTION

It is therefore an object of the present invention to provide a memory system that uses semiconductor memories with defective bits and nevertheless provides good memory storage at every memory location at a systems level.

It is another object of the present invention to provide a method of correcting bad bits within semiconductor memories and not significantly impact the overall data access times of the system.

Briefly, a memory system embodiment of the present invention comprises a plurality of dynamic random access memories with bad bits, a static random access memory and a mapping logic to redirect external memory accesses to bad-bit locations in the dynamic random access memories to good storage cells within the static random access memory.

An advantage of the present invention is that a memory system is provided for large memory storage with relatively inexpensive near-perfect, but still defective dynamic random access memories.

A further advantage of the present invention is that a memory system is provided in which redundant memory cells are available for on-line substitution after an initial installation.

Another advantage of the present invention is that a method is provided in which defective dynamic random access memories that would otherwise be discarded during manufacture can be used successfully at the memory system level.

These and other objects and advantages of the present invention will no doubt become obvious to those of ordinary skill in the art after having read the following detailed description of the preferred embodiment which is illustrated in the drawing figures.

IN THE DRAWINGS

FIG. 2 is a timing diagram related to the redundant memory storage cell array in the memory system of FIG. 1;

FIG. 6 is a schematic diagram of the X-address decoder in the memory system of FIG. 1;

FIG. 7 is a schematic diagram of the Y-address decoder in the memory system of FIG. 1;

FIG. 8 is a schematic diagram of the sense amplifier in the memory system of FIG. 1 for reading data from the redundant memory storage cell array to substitute for defective data from the almost good DRAM's that would otherwise appear on the databus;

FIG. 9 is a schematic diagram of the data buffer in the memory system of FIG. 1 for writing data to the redundant memory storage cell array for later substitution of good data when a defective bit in the almost good DRAM's is accessed from the databus; and FIG. 10 is a schematic diagram of the read/write unit in the memory system of FIG. 1 for steering data through the sense amplifier and data buffer.

DETAILED DESCRIPTION OF THE PREFERRED EMBODIMENT

Figure 1:
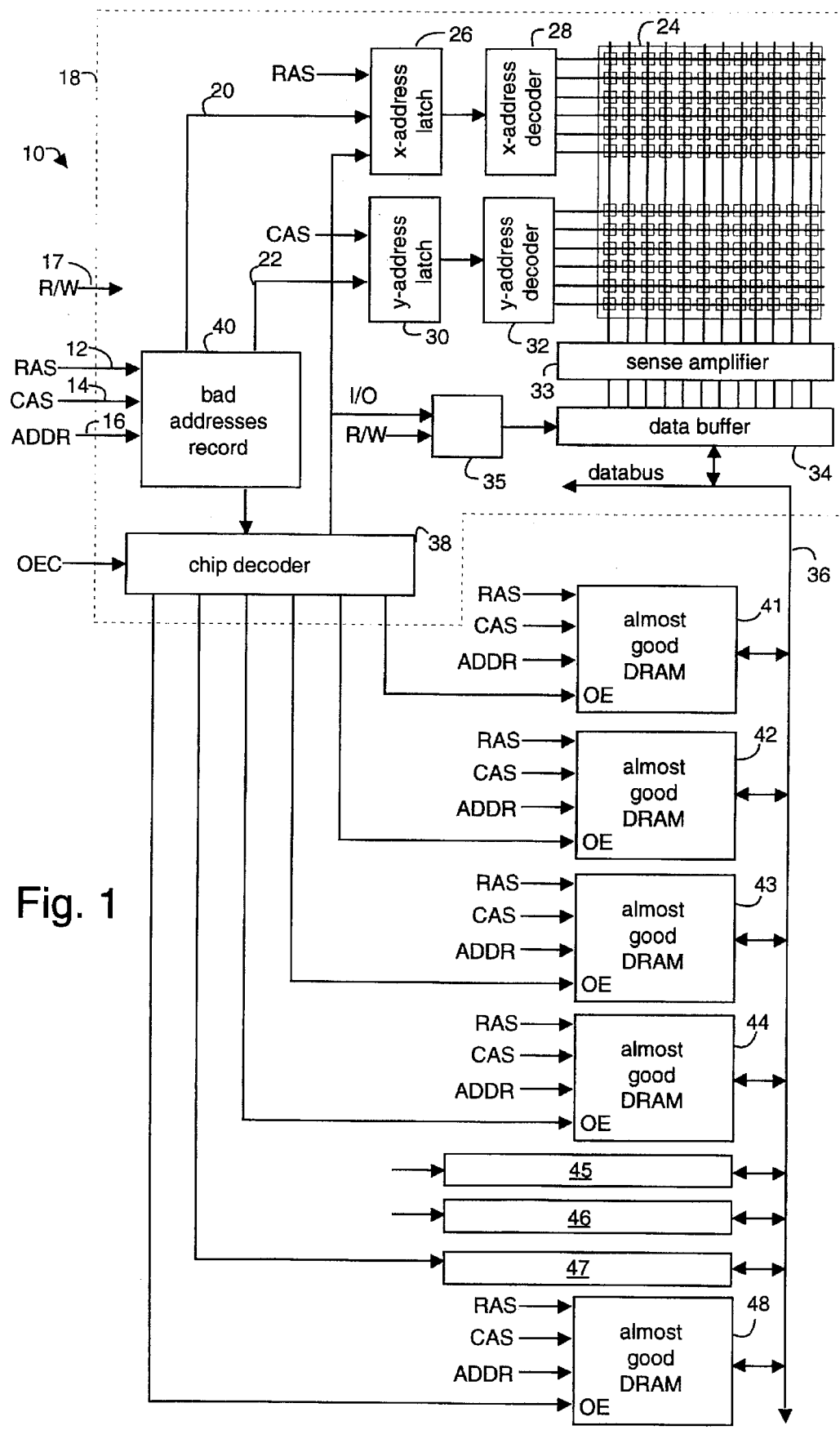
FIG. 1 is a block diagram of a memory system embodiment of the present invention.

FIG. 1 illustrates a memory system embodiment of the present invention referred to herein by the general reference numeral 10. The system 10 receives a row address strobe (RAS) 12, a column address strobe (CAS) 14, a system memory access address (ADDR) 16, and a read/write (R/W) control 17 from an external computer system. A memory repair unit (MRU) 18 receives the RAS, CAS and ADDR, and translates and splits the ADDR into X and Y address buses 20 and 22, e.g., row and column, to address a redundant memory storage cell array 24 comprising thousands of static random access memory (SRAM) elements, each at an intersection of the row and column lines. The X-address bus 20 is latched by an X-address latch 26 and decoded to single lines by an X-address decoder 28. The Y-address bus 22 is latched by a Y-address latch 30 and decoded to single lines by a Y-address decoder 32. A sense amplifier 33 and a data buffer 34 are switched between reading and writing by a R/W unit 35. Data is communicated between the redundant memory storage cell array 24 and a databus 36 according to the rows selected by the decoders 28 and 32 and the corresponding sense amplifier 33 and data buffer 34. A memory system output enable control, a chip decoder 38 and a bad addresses record (BAR) 40 select which of a plurality of dynamic random access memories (DRAM's) 41–48, or the sense amplifier 33 and data buffer 34, will be selectively enabled to the databus 36 according to an address present on the ADDR 16.

The DRAM's 41–48 may each have one or more bad bits, e.g., hard errors. The BAR 40 functions to enable the sense amplifier 33 and data buffer 34 instead of one of the DRAM's 41–48 when the value on ADDR 16 indicates that a known bad bit at particular address in a particular DRAM 41–48 is being accessed by the external computer system. The BAR 40 is programmed with the location of the known bad bits in the DRAM's 41–48 and the corresponding X and Y address in array 24 to substitute. In such an event, the BAR 40 also supplies a substitute address on the X and Y address buses 20 and 22 that has been mapped-over from the ADDR 16. The storage size of array 24 that is needed to provide substitute access for the DRAM's 41–48 is a function of how many bad bits exist in each DRAM 41–48. An arbitrary limit can be imposed to settle how large the array 24 must be consequently.

FIG. 2 illustrates the basic timing for system 10, especially MRU 18. In a first cycle, both the X and Y address buses 20 and 22 change. In the second cycle, only the Y address bus 22 changes. Sometime after the X-address becomes valid, the word line and then the bit lines in array 24 become valid. This then permits the sense amplifier 33 to have valid data, and data can then be output to the databus 36 in a first access time ($t_{acc1}$) for the for cycle and a second access time ($t_{acc2}$) for the second cycle. For DRAM's 41–48 that have access times of sixty nanoseconds, $t_{acc1}$ is preferably thirty nanoseconds and $t_{acc2}$ is preferably ten nanoseconds.

Figure 3:
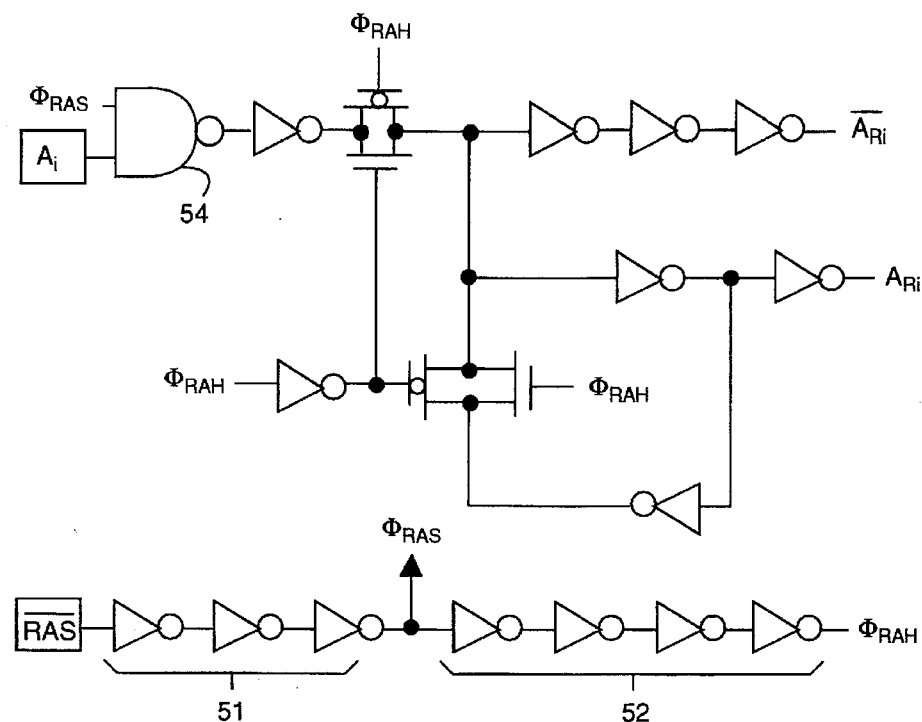
FIG. 3 is a schematic diagram of the X-address latch in the memory system of FIG. 1.

FIG. 3 shows an exemplary latch 50 that is repeated many times in the X-address latch 26 in more detail. A delay line 51 receives the not-RAS signal and produces a delayed version, signal $\Phi_{RAS}$. A delay line 52 receives the $\Phi_{RAS}$ signal and produces a delayed signal $\Phi_{RAH}$. The system addresses "$A_i$", e.g., $A_0$–$A_{11}$ for a 4M×8 DRAM system, are latched through to produce complementary "row" address signals not-$A_{Ri}$ and $A_{Ri}$.

Figure 4:
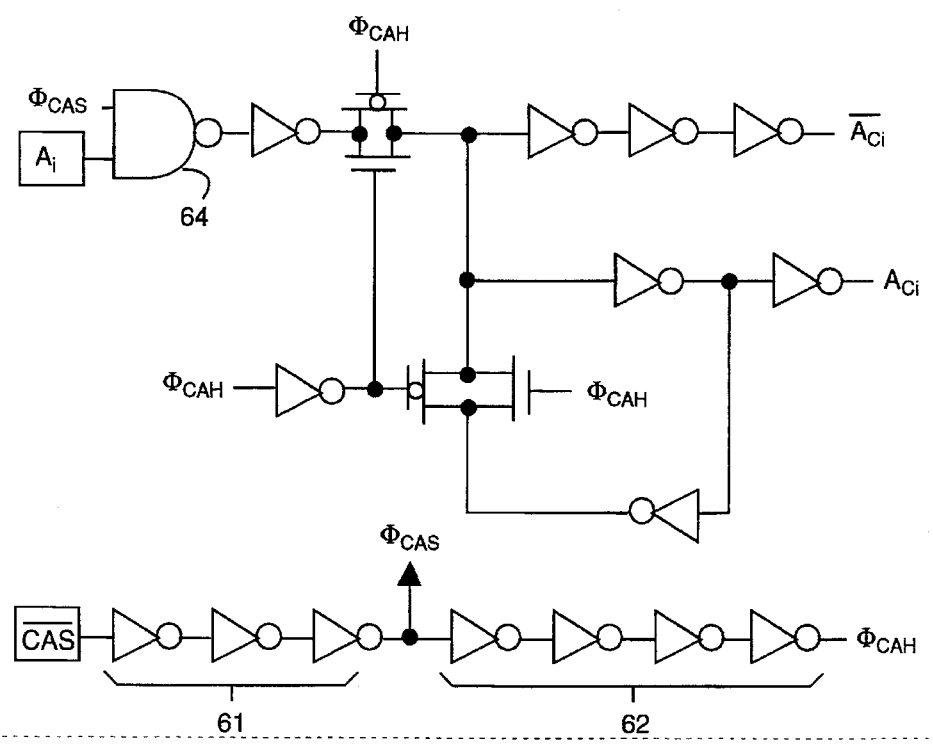
FIG. 4 is a schematic diagram of the Y-address latch in the memory system of FIG. 1.

FIG. 4 shows an exemplary latch 60 that is repeated many times in the X-address latch 30 in more detail. A delay line 61 receives the not-CAS signal and produces a delayed version, signal $\Phi_{CAS}$. A delay line 62 receives the $\Phi_{CAS}$ signal and produces a delayed signal $\Phi_{RAH}$. The system addresses "$A_i$", e.g., $A_0$–$A_{11}$ for a 4M×8 DRAM system, are latched through to produce complementary "row" address signals not-$A_{Ci}$ and $A_{Ci}$.

Figure 5:
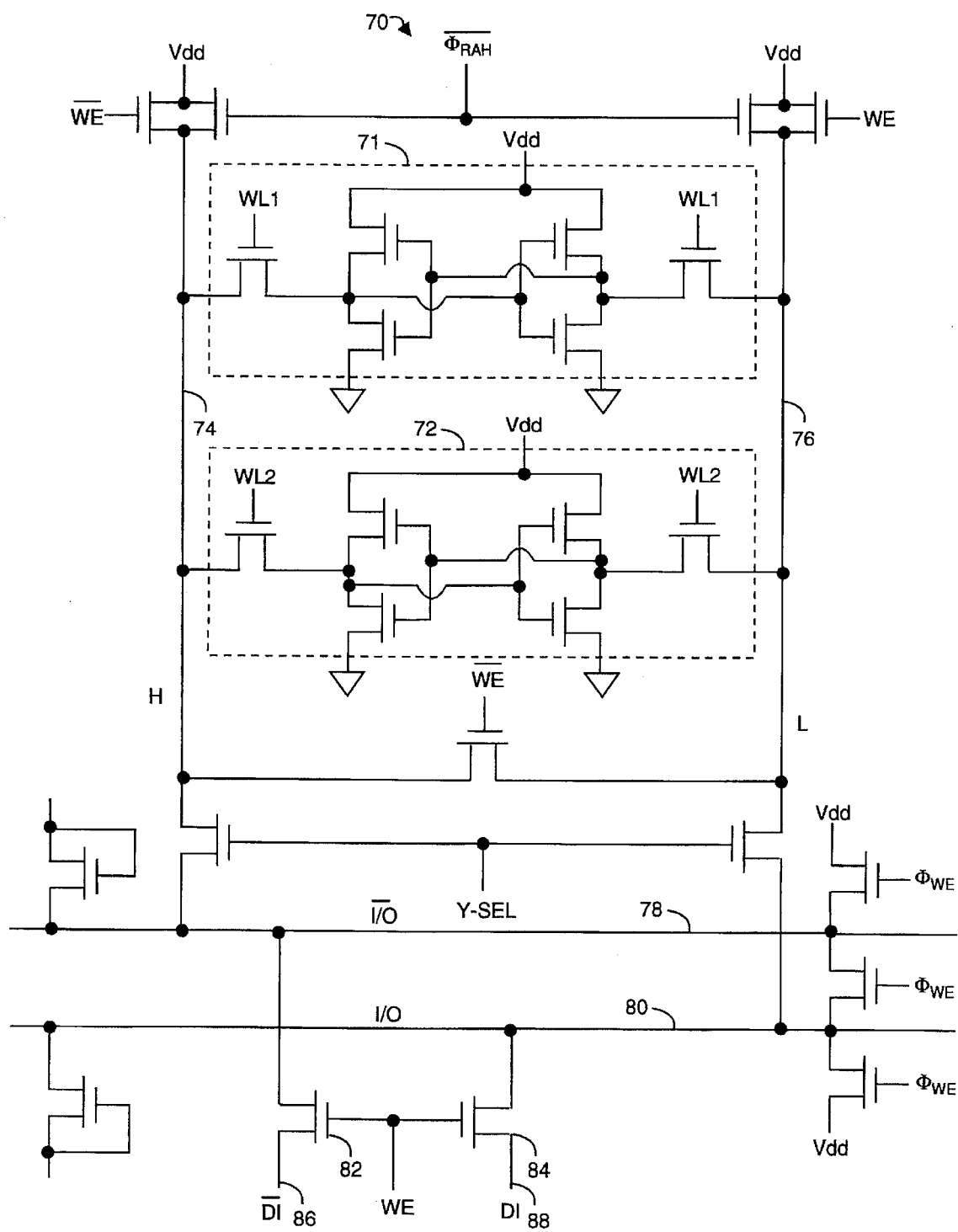
FIG. 5 is a schematic diagram of the storage memory cell array in the memory system of FIG. 1.

FIG. 5 shows an exemplary memory cell 70 with memory elements 71 and 72 that are repeated many times in the redundant storage memory cell array 24. The X-address decoder 28 produces many "word lines" (WLi) that respectively control the connection of "H" and "L" lines 74 and 76 to the memory elements 71 and 72. The Y-address decoder 32 produces many "Y-select lines" (Y-SELECT) that respectively control the connection of the "H" and "L" lines 74 and 76 to a pair of not-I/O and I/O lines 78 and 80. During write cycles, e.g., when "WE" is true, the internal clock "WE" precharges and equalizes the I/O and not-I/O lines 78 and 80, then a pair of switches 82 and 84 connect a pair of data input lines "not-DI" and "DI" 86 and 88 to the not-I/O and I/O lines 78 and 80.

FIG. 6 shows an exemplary word line driver 90 that is repeated many times in the X-address decoder 28. The line driver 90 is enabled when $\Phi_{RAH}$ goes true, switching on a pair of transistors 92 and 94. The row address inputs $A_{R1}$–$A_{R11}$ control which of a set of transistors 96 will control the word line output "WLi".

FIG. 7 shows an exemplary word line driver 100 that is repeated many times in the Y-address decoder 32. The line driver 100 is enabled when $\Phi_{RAH}$ goes true, switching on a pair of transistors 102 and 104. The row address inputs $A_{R1}$–$A_{R11}$ control which of a set of transistors 106 will control the Y-select output "Y-SELECT".

FIG. 8 shows an exemplary sense amplifier 110 that is repeated many times in the sense amplifier 33. The not-I/O, I/O, and not-WE signals are all input and combined to produce a data output signal "Dout". The data buffer 34 is disabled during write cycles which are indicated by not-WE being false.

FIG. 9 shows an exemplary data buffer 120 that is repeated many times in the data buffer 34. The Dout is gated and buffered through when the not-WE is false, e.g., during a read cycle, to produce a data input/output signal "I/O PAD" for connection to the external computer system.

FIG. 10 shows an exemplary read/write controller 130 that is repeated many times in the R/W unit 35. The I/O signal, e.g., I/O signal 80 (FIG. 5), is gated and buffered through when an external read/write control is true for writing. This produces "DI" and "not-DI" signal, e.g., 88 and 86 (FIG. 5).

A system memory module may thus be constructed using inexpensive slightly-defective DRAM devices connected to a data bus. Each DRAM can have at least one bad memory bit cell, e.g., that is externally accessible. A substitution memory is also connected to the data bus. A timing and control unit intercepts each external memory access signal from an address bus connected to the slightly-defective DRAM devices. A latched-address bus output is connected to the substitution memory. Comparator logic and mapping memory receive the external memory access signals and select whether the substitution memory or one of the DRAM devices should respond to the external memory access. An external programmer can be used for selecting, on an address-by-address basis, which of a plurality of system memory module address inputs cause the substitution memory to respond instead of any of the slightly-defective DRAM devices. A memory access cycle to a defective memory bit is programmably redirected to access the substitution memory for both read and write memory cycles.

Preferably, the substitution memory comprises a static random access memory with access times faster than that the slightly-defective DRAM devices. The comparator logic and mapping memory, e.g., BAR 40, includes an electrically erasable and programmable read only memory (EEPROM) with external connections for programming of mapping addresses corresponding to addresses within the defective memory storage by an external module test unit.

As exemplified by the MRU 18 (FIG. 1), substitution memory, the timing and control unit and the comparator logic and control unit can all be integrated on a single integrated circuit with connections provided for externally connected ones of the plurality of slightly-defective DRAM devices.

Alternatively, such substitution memory, the timing and control unit, the comparator logic and control unit, and the plurality of slightly-defective DRAM devices can all be constructed on one single-in-line memory module (SIMM) with external connections provided for interfacing through printed circuit board memory module connectors to a personal computer.

Initially, a memory module test and programming unit is used for locating the defective bits by their corresponding system addresses in the DRAM's 41–48. Any of a number of conventional means may be used for this purpose. The bits that are to be substituted are allocated within redundant memory, e.g., array 24. To do this, the tester sequences through the DRAM memory addresses. Such addresses are registered in a programmable read only memory. The defective memory location addresses in groups can be mapped according to the particular addresses' row position in a memory array. A row and column organization of memory cells can be used to preserve the access timing of page-mode type DRAMs.

Programming a combination dynamic random access memory (DRAM) and static random access memory (SRAM) memory module to respond with SRAM rather than with DRAM for memory locations in the DRAM with bad bits, comprises writing a test pattern to the DRAM at a first address, reading back data from the DRAM at the first address, comparing the data read with the data written, and programming a means for permanently selecting the SRAM to respond instead of the DRAM at the first address if the step of comparing indicates a faulty memory cell within the DRAM. Such method can further comprise mapping any defective memory location addresses that are detected in the step of comparing in groups according to the particular addresses' row position in a memory array. A row and column organization of memory cells can be used to preserve the access timing of page-mode type DRAMs.

A memory module can respond to a memory access by memory array 24 rather than by DRAM's 41–48 for memory locations in the DRAM with bad bits by inputting an address to the memory module for a memory access cycle. Then, comparing the address to a list of addresses previously identified as having bad bits in the DRAM. And substituting-in a location in the SRAM for each previously identified bad-bit DRAM address.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A memory repair integrated circuit (IC), comprising on a single semiconductor device:

a bad address record (BAR) with an input connected to receive data access requests by system addresses and a plurality of outputs for selecting one of several off-chip dynamic random access memories (DRAM's) or an on-chip memory array to respond to for each particular data access request according to a prerecorded list of defective bits in said off-chip DRAM's;

an X-address latch and decoder connected to receive said system addresses from the BAR and connected to a first plurality of rows of memory elements in said memory array;

a Y-address latch and decoder connected to receive said system addresses from the BAR and connected to a second plurality of rows of memory elements in said memory array;

a sense amplifier connected to receive data from said first and second plurality of rows of memory in said memory array; and a data buffer connected to receive data from the sense amplifier and to provide said received data to a databus connected to said DRAM's, and connected to write data to said memory array from said databus.

2. The IC of claim 1, wherein:

the X-address latch and decoder, and the Y-address latch and decoder comprise a set of programmable fuses each individually connected to a plurality of transistors controlled by said system addresses and having a word-line and a y-select output to control access to said memory array.

3. The IC of claim 1, wherein:

the X-address latch and decoder, and the Y-address latch and decoder comprise a plurality of programmable voltage threshold transistors controlled by said system addresses and having a word-line and a y-select output to control access to said memory array.

4. A system memory module, comprising:

a plurality of possibly-defective memory devices connected to a data bus and each having at least one bad memory bit cell that is externally accessible;

a substitution memory connected to said data bus;

a timing and control unit having an input to receive an external memory access signal, an address bus output connected to the possibly-defective memory devices, and a latched-address bus output connected to the substitution memory; and a comparator logic and mapping memory connected to receive said external memory access signals and having a memory substitution control output connected to the timing and address comparator unit for selecting whether the substitution memory or the plurality of possibly-defective memory devices can respond to an external memory access, and having programming means for selecting, on an address-by-address basis, which of a plurality of system memory module address inputs cause the substitution memory to respond instead of any of the possibly-defective memory devices, wherein a memory access cycle to an address within the possibly-defective memory devices actually having a defective memory bit is programmably redirected to access the substitution memory for both read and write memory cycles.

5. The module of claim 4, wherein:

the plurality of possibly-defective memory devices comprises dynamic random access memories with partially defective memory storage;

the substitution memory comprises a static random access memory having an access time faster than that of the plurality of possibly-defective memory devices; and the comparator logic and mapping memory comprises an electrically erasable and programmable read only memory (EEPROM) with external connections for programming of mapping addresses corresponding to addresses within said defective memory storage by an external module test unit.

6. The module of claim 4, wherein:

the plurality of possibly-defective memory devices comprises a plurality of dynamic random access memory (DRAM) integrated circuit devices connected to a data bus and each having at least one bad memory bit cell that is externally accessible;

the substitution memory comprises a static random access memory (SRAM) connected to said data bus;

the comparator logic and mapping memory comprises an electrically erasable and programmable read only memory (EEPROM) connected to receive said external memory access signals and having a substitution control output connected to the timing and control unit to cause either the DRAM to be enabled or the SRAM to be enabled, and having programming means for selecting on an address-by-address basis which of a plurality of system memory module address inputs cause said substitution control output to enable the SRAM instead of the DRAM, wherein a memory access cycle to an address within the DRAM integrated circuit devices having a defective memory bit is redirected to the SRAM for both read and write memory accesses.

7. The module of claim 4, wherein:

the substitution memory, the timing and control unit and the comparator logic and control unit are all integrated on a single integrated circuit with connections provided for externally connected ones of the plurality of possibly-defective memory devices.

8. The module of claim 4, wherein:

the substitution memory, the timing and control unit, the comparator logic and control unit, and the plurality of possibly-defective memory devices are all constructed on one single-in-line memory module (SIMM) with external connections provided for interfacing through printed circuit board memory module connectors to a personal computer.

9. A memory module test and programming unit for programming a discrete and separate programmable read only memory (PROM) with which memory locations in a combination of discrete and separate dynamic random access memories (DRAM) and discrete and separate static random access memories (SRAM) in a single memory module are to respond with the SRAM rather than with the DRAM due to non-programmable or non-readable memory locations within said DRAM, comprising:

addressing means for accessing a plurality of memory addresses associated with a memory module and for determining which memory locations have defects; and programming means for registering the addresses of non-programmable or non-readable memory locations in a programmable read only memory (PROM) connected between a DRAM and an SRAM for preferring the SRAM over the DRAM at each of said non-programmable or non-readable memory locations during an external access of said memory module.

10. The unit of claim 9, further comprising:

means for mapping said non-programmable or non-readable memory location addresses;

wherein, said non-programmable or non-readable memory location addresses are grouped and then mapped according to a row position of each particular address in a memory array; and wherein, a pre-existing row and column organization of the memory cells is mimicked during read operations in order to preserve the access timing of page-mode types of said DRAMs.

11. A method of programming a memory module comprised of a combination of discrete and separate dynamic random access memory (DRAM) and static random access memory (SRAM) to respond with SRAM rather than with DRAM for memory locations in said DRAM with non-programmable or non-readable memory bits, comprising the steps of:

writing a test pattern to said DRAM at a first address;

reading back data from said DRAM at said first address;

comparing said data read with said data written; and programming a means for permanently selecting said SRAM to respond instead of said DRAM at said first address if the step of comparing indicates a faulty memory cell within said DRAM.

12. The method of claim 11, further comprising the subsequent step of:

mapping any non-programmable or non-readable memory location addresses that are detected in the step of comparing in groups according to the particular addresses' row position in said memory array to a row and column organization of memory cells, wherein the access timing of page-mode types of said DRAMs is preserved.

13. A method for a memory module to respond to a memory access where said memory module comprises a combination of discrete and separate dynamic random access memory (DRAM) and static random access memory (SRAM) memory that provides for a response by said SRAM rather than by said DRAM for memory locations in said DRAM with non-programmable or non-readable bits, comprising the steps of:

inputting an address to said memory module for a memory access cycle;

comparing said address to a list of addresses previously identified as having non-programmable or non-readable bits in said DRAM; and substituting-in a location in said SRAM for each previously identified non-programmable or non-readable DRAM address.

* * * * *